United States Patent
Kachian et al.

(10) Patent No.: US 10,366,878 B2
(45) Date of Patent: Jul. 30, 2019

(54) SELECTIVE DEPOSITION THROUGH FORMATION OF SELF-ASSEMBLED MONOLAYERS

(71) Applicant: Applied Materials, Inc., Santa Clara, CA (US)

(72) Inventors: Jessica Sevanne Kachian, Sunnyvale, CA (US); Tobin Kaufman-Osborn, Sunnyvale, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 83 days.

(21) Appl. No.: 15/587,997

(22) Filed: May 5, 2017

(65) Prior Publication Data

US 2017/0323781 A1    Nov. 9, 2017

Related U.S. Application Data

(60) Provisional application No. 62/332,524, filed on May 6, 2016.

(51) Int. Cl.

| | | |
|---|---|---|
| *H01L 21/02* | (2006.01) | |
| *C23C 16/56* | (2006.01) | |
| *C23C 16/455* | (2006.01) | |
| *C23C 16/40* | (2006.01) | |
| *C23C 16/04* | (2006.01) | |
| *C23C 16/02* | (2006.01) | |
| *H01L 21/3105* | (2006.01) | |
| *H01L 21/768* | (2006.01) | |

(52) U.S. Cl.
CPC .... *H01L 21/02118* (2013.01); *C23C 16/0272* (2013.01); *C23C 16/04* (2013.01); *C23C 16/401* (2013.01); *C23C 16/45525* (2013.01); *C23C 16/45527* (2013.01); *C23C 16/45553* (2013.01); *C23C 16/56* (2013.01); *H01L 21/0228* (2013.01); *H01L 21/02211* (2013.01); *H01L 21/3105* (2013.01); *H01L 21/76849* (2013.01)

(58) Field of Classification Search
None
See application file for complete search history.

(56) References Cited

U.S. PATENT DOCUMENTS

| | | | |
|---|---|---|---|
| 6,518,168 B1 * | 2/2003 | Clem | B05D 1/283 257/E21.171 |
| 7,368,377 B2 * | 5/2008 | Whelan | B82Y 30/00 438/643 |
| 9,299,376 B1 * | 3/2016 | Fernandez | G11B 5/60 |
| 2006/0128142 A1 | 6/2006 | Whelan et al. | |
| 2008/0116481 A1 | 5/2008 | Sharma et al. | |
| 2011/0124187 A1 | 5/2011 | Afzali-Ardakani et al. | |
| 2011/0198736 A1 | 8/2011 | Shero et al. | |
| 2013/0065400 A1 | 3/2013 | Yoshimizu et al. | |
| 2013/0292650 A1 | 11/2013 | Jung et al. | |
| 2015/0234219 A1 | 8/2015 | Petcavich et al. | |
| 2015/0294863 A1 | 10/2015 | Nemani et al. | |
| 2017/0323781 A1 * | 11/2017 | Kachian | C23C 16/45525 |

FOREIGN PATENT DOCUMENTS

| | | |
|---|---|---|
| JP | 2013062278 A | 4/2013 |
| KR | 20100054436 A | 5/2010 |
| WO | 97/07429 A1 | 2/1997 |

OTHER PUBLICATIONS

PCT International Search Report and Written Opinion in PCT/US2017/031285 dated Jul. 31, 2017, 11 pages.

\* cited by examiner

*Primary Examiner* — Angel Roman
(74) *Attorney, Agent, or Firm* — Servilla Whitney LLC

(57) ABSTRACT

Methods of depositing a film selectively onto a first substrate surface relative to a second substrate surface are described. The methods include net chemisorption of a self-assembled monolayer on the second surface to prevent deposition of the film on the second surface.

16 Claims, No Drawings

SELECTIVE DEPOSITION THROUGH FORMATION OF SELF-ASSEMBLED MONOLAYERS

CROSS-REFERENCE TO RELATED APPLICATIONS

This application claims priority to U.S. Provisional Application No. 62/332,524, filed May 6, 2016, the entire disclosure of which is hereby incorporated by reference herein.

FIELD

Embodiments of the disclosure generally relate to methods of selectively depositing a film. More particularly, embodiments of the disclosure are directed to methods of selectively depositing a film using self-assembled monolayers and an optional treatment reactant.

BACKGROUND

Selective deposition processes are gaining a lot of momentum mostly because of the need for patterning applications for semiconductors. Traditionally, patterning in the microelectronics industry has been accomplished using various lithography and etch processes. However, since lithography is becoming exponentially complex and expensive the use of selective deposition to deposit features is becoming much more attractive. Another potential application for selective deposition is gap fill. In gap fill, the fill film is grown selectively from the bottom of a trench towards the top. Selective deposition could be used for other applications such as selective sidewall deposition where films are grown on the side of the fin. This would enable the deposition of a sidewall spacer without the need for complex patterning steps.

Therefore, there is a need in the art for methods of depositing a film onto one surface selectively over a different surface.

SUMMARY

One or more embodiments of the disclosure are directed to processing methods comprising providing a substrate with a first surface and a second surface. The substrate is exposed to a SAM precursor to form a self-assembled monolayer on the second surface. A film is deposited on the first surface selectively over the second surface. The self-assembled monolayer is removed from the second surface.

Additional embodiments of the disclosure are directed to processing methods comprising providing a substrate with a first surface and a second surface. The substrate is exposed to a SAM precursor to form a self-assembled monolayer on the second surface. The SAM precursor comprises a composition with a head group that adsorbs relatively quickly to the second surface and a tail group that associates with other tail groups relatively slowly through van der Waals interaction. A film is deposited on the first surface selectively over the second surface. The self-assembled monolayer is removed from the second surface.

Further embodiments of the disclosure are directed to processing methods comprising providing a substrate with a first surface and a second surface. The first surface comprises an H-terminated SixGe1-x, metal, or metal oxide, and the second surface comprises hydroxyl-terminations on a Si-based dielectric. The substrate is exposed to a SAM precursor and a co-reactant to form a self-assembled monolayer on the second surface. The SAM precursor comprises a composition with a head group that adsorbs relatively quickly to the second surface and a tail group that associates with other tail groups relatively slowly through van der Waals interaction. Forming the self-assembled monolayer occurs at a temperature $T_{treatment}$. The SAM precursor comprises a chlorosilane and/or silylamine-based molecule with a linear, saturated hydrocarbon tail of 6-20 carbons and at least two —Cl and/or —NR$_2$ groups, where each R is independently methyl or ethyl. The temperature of the substrate is elevated to a temperature T greater than $T_{treatment}$ and the substrate is held at the temperature T for a time. The temperature of the substrate is elevated to a temperature $T_{ALD}$ greater than or equal to T and a film is deposited on the first surface selectively over the second surface by atomic layer deposition. The self-assembled monolayer is removed from the second surface.

DETAILED DESCRIPTION

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface may comprise a metal, metal oxide, or H-terminated Si$_x$Ge$_{1-x}$, and the second substrate surface may comprise a Si-containing dielectric, or vice versa. In some embodiments, a substrate surface may comprise certain functionality (e.g., —OH, —NH, etc.).

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Embodiments of the disclosure provide methods of selectively depositing a film onto one surface over a second surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

In recent decades, the semiconductor community has made attempts to improve integrated circuit (IC) processing by replacing lithography steps with alternatives that translate to lower cost, reduced processing time, and smaller feature sizes. Many of these alternatives fall under the blanket category of "selective deposition." In general, selective deposition refers to a process for which the net deposition rate is higher on the target substrate material relative to other substrate materials, such that the desired film thickness is achieved on the target substrate material with negligible deposition on the other substrate materials (where "negligible" is defined by process constraints).

One strategy to achieve selective deposition employs the use of blocking layers. Ideally, this strategy involves (1) formation of a blocking layer on substrate materials on which deposition is to be avoided with negligible impact to the target substrate material, (2) deposition on the target substrate material (where deposition on other substrate materials is "blocked" by the blocking layer), and (3) removal of the blocking layer without net adverse effects to the deposited film.

Embodiments of the disclosure incorporate a blocking layer called a self-assembled monolayer (SAM). A self-assembled monolayer (SAM) consists of an ordered arrangement of spontaneously assembled organic molecules adsorbed on a surface. These molecules are typically comprised of one or more moieties with an affinity for the substrate (head group) and a relatively long, inert, linear hydrocarbon moiety (tail group).

In this case, SAM formation happens through fast adsorption of molecular head groups at the surface and slow association of molecular tail groups with each other through van der Waals interactions. SAM precursors are chosen such that the head group selectively reacts with the substrate materials to be blocked during deposition. Deposition is then performed, and the SAMs are typically removed through thermal decomposition (with desorption of any byproducts) or an integration-compatible ashing process. Successful selective deposition through this idealized formation and use of SAMs has been demonstrated for a number of systems; however, success is essentially limited to a solution-based approach for SAM formation (i.e., wet functionalization). Wet functionalization approaches are not only incompatible with vacuum-based integration schemes but also require sonication post-SAM formation to eliminate physisorbed SAM precursor. This suggests successful selective SAM formation (on one substrate versus another) cannot rely on the functionalization process alone to yield the overall selective chemisorption result with no physisorption.

Embodiments of the disclosure advantageously provide a dry functionalization (vapor phase) strategy to selectively form SAMs on the substrate materials to be blocked during deposition so as to achieve selective deposition on the target substrate material. Without being bound by any particular theory of operation, it is believed that the SAM precursor exposure process does not result in selective binding of the SAM precursor to one substrate over another. Rather, the overall all-vapor strategy comprised of a unique SAM precursor exposure process and post-treatment conditions yield selective SAM formation on substrate materials to be blocked during deposition and subsequent selective deposition on the target substrate material.

Some embodiments of the disclosure advantageously provide a modification to the SAM precursor exposure itself—through incorporation of a treatment co-reactant—to maintain the all-vapor nature of the overall process while increasing the SAM surface coverage on the materials to be blocked, thus increasing blocking capability and selective deposition margin.

Some embodiments of the disclosure provide a SAM precursor and a treatment co-reactant, which are both introduced to reaction chambers in vapor phase through separate lines. For SAM precursor and treatment co-reactant exposures, soak or flow conditions may be used (with or without the assistance of an inert gas), with exposure times that vary from seconds to days, substrate temperatures that range from room temperature to approximately 600° C. In some embodiments, the substrate temperature can be in the range of about room temperature (e.g., 25° C.) to about 500° C., or in the range of about room temperature to about 400° C., 350° C., 300° C., 250° C. or 200° C., and chamber/dose pressures up to approximately 760 Torr. These conditions can be applied to a range of SAM precursor head group moieties and tail lengths, treatment "co-reactant" functional groups, and substrate materials used in the semiconductor industry.

In some embodiments, surface pre-treatment or pre-clean may be used to generate desired surface terminations before SAM precursor or treatment co-reactant exposure. The treatment co-reactant is a molecule that undergoes ligand exchange with unreacted head groups on the SAM precursor. The treatment co-reactant is chosen such that it does not chemisorb on any substrate materials at or below the substrate temperature used for the SAM precursor exposure. One or more methods for introducing the treatment co-reactant into the process is to alternate exposure (spatially or temporally) with the SAM precursor, thus both reducing the potential for particle formation and driving ligand exchange with unreacted head groups on the chemisorbed SAM precursor. (In some embodiments, the SAM precursor has more than one head group for use with the treatment co-reactant to be beneficial.) Following this ligand exchange, neighboring chemisorbed SAM precursors react with each other via a condensation reaction (through the exchanged ligands) that yields crosslinking between chemisorbed SAM molecules and a volatile byproduct that does not decompose or react with any substrate materials under the treatment conditions. This crosslinking promotes tail alignment of chemisorbed SAM molecules, thus allowing for further chemisorption of SAM precursor during the subsequent SAM precursor exposure. This cyclic SAM precursor/treatment co-reactant approach, in which alternating SAM precursor and treatment co-reactant exposures are performed (followed by one final SAM precursor exposure), is continued for the number of cycles that yields the desired blocking/selectivity requirements for the target application.

According to one or more embodiments, a treatment co-reactant process provides selective deposition on metal, metal oxide, or hydrogen-terminated $Si_xGe_{1-x}$ substrates and not silicon-containing dielectric substrates, which typically have a high concentration of surface Si—OH sites. Examples of SAM precursors for such an application include but are not limited to chlorosilane- or silylamine-based molecules with a linear, saturated hydrocarbon tail of 6-20 carbon atoms and >1 —Cl or —NR$_2$ (R=methyl or ethyl) head groups on the silicon center, respectively. (In the case of 2 versus 3 head groups, a small alkyl moiety (e.g., —CH$_3$) in the former may replace the position of a head group in the latter.) According to some embodiments, a reaction of these precursors with silicon-containing dielectrics yields Si—O bond formation between the SAM precursor and the substrate through reaction of surface hydroxyls with Si—Cl or Si—N precursor bonds to yield stable, volatile HCl or alkylamine byproducts, respectively. It is believed that this is the likely reaction observed under conditions targeted for this application; however, some head groups may remain unreacted upon chemisorption of the SAM precursor, so that the use of the treatment co-reactant may increase selectivity and/or reactivity. For example, a low molecular weight—relative to the SAM precursor—alcohol could serve as the treatment co-reactant. Alcohol molecules could undergo ligand exchange with the chemisorbed SAM precursor by replacing unreacted —NR$_2$ or —Cl head groups on the chemisorbed SAM precursor with alkoxy groups and liberating alkylamine or HCl molecules, respectively. Neighboring chemisorbed SAM precursors could subsequently undergo a condensation reaction, which crosslinks them through an Si—O—Si bond and yields a stable, volatile ether byproduct under the treatment conditions. Water can also serve as the treatment co-reactant. (For example, the hydroxyl portion of the water molecule is exchanged with the unreacted —NR$_2$ or —Cl head groups of the chemisorbed SAM precursor, liberating alkylamine and HCl molecules. As with alcohol treatment co-reactants, the subsequent condensation reaction yields an Si—O—Si linkage between adjacent chemisorbed SAM molecules; however, in this instance water (versus ether) may be the more stable, volatile byproduct under the treatment conditions.) Alcohols are likely preferred over water as the treatment co-reactant in the case of selective deposition on metal or hydrogen-terminated $Si_xGe_{1-x}$ substrates, as water is more likely to oxidize these substrates under the treatment conditions. Further, use of the alcohol can also allow for metal oxide reduction under the SAM precursor and treatment co-reactant temperatures, thus mitigating reaction of the SAM precursor with metal oxide hydroxyl groups.

However, if the target substrate (for deposition) is a metal oxide substrate, water may be used as the treatment co-reactant given the potential for metal oxide reduction by alcohols—particularly an issue for thin metal oxide films. Target deposition on metal oxide films can pose a problem in general, given the use of SAM precursors such as those described above: SAM precursor could chemisorb on the metal oxide substrate, likely via an analogous reaction with metal oxide (versus silicon-containing dielectric) surface hydroxyls, thus blocking deposition on the target substrate as well. This broaches the concept of nonselective binding of the SAM precursor on the target versus non-target substrate materials, and introduces the overall strategy or methods to achieve selective binding post-SAM precursor exposure but prior to ALD. This strategy may or may not be combined with the treatment co-reactant strategy. In the following discussion, treatment refers to the SAM precursor exposure process with or without a treatment co-reactant.

Returning to the case of the metal oxide target substrate, it is possible that under the SAM precursor exposure conditions, the SAM precursor chemisorbs on both the metal oxide substrate and the silicon-containing dielectric substrate (non-target substrate). This problem could be remedied if, after the final SAM precursor exposure but before or near the start of subsequent ALD, the substrate is elevated to a temperature, T, where $T_{treatment} < T \leq T_{ALD}$, and at which the population of chemisorbed SAM precursor remains effectively the same on the silicon-containing dielectric but diminishes on the metal oxide substrate through a recombinative desorption process or through a decomposition process for which the resultant adduct either desorbs or does not contribute to a nucleation delay on the metal oxide substrate. This approach can also be applied to non-selective chemisorption of the SAM precursor during SAM precursor exposure for cases where the SAM precursor chemisorbs on the target substrate by an alternate mechanism (e.g., through reaction of the hydrocarbon tail with the metal oxide surface) that also leads to a surface product that is less thermally stable than that on the substrate to be blocked. Further, this approach can also be extended to other sets of substrates for which selective deposition is desired and may involve alternative SAM precursors.

Other factors—either individually or in combination—can contribute to the net result that the SAM precursor exposure process itself is not selective. As mentioned earlier, SAM precursor physisorption can present a problem. While the SAM precursor tails can provide a stabilizing effect through the packing density they afford (through association of the "tails" via a large sum of van der Waals forces), these long tails also encourage physisorption (for the same reason) and also make vapor delivery an onerous process (molecular weight). In particular, vapor delivery of a SAM precursor such as those described here may require that the SAM precursor delivery equipment (e.g., ampoule and lines) be raised to a temperature much higher than that at which the SAM precursor is stably chemisorbed on substrate materials relative to the length of the deposition process. Under these conditions, the substrate temperature must be kept at a temperature lower than the temperature of the delivery equipment during the SAM precursor exposure process, thus leading to non-selective physisorption on all substrate materials. To address non-selective physisorption occurring during the SAM precursor exposure process, a thermal treatment must be applied following this process. The substrate must be elevated to a temperature, T, where $T_{treatment} < T \leq T_{ALD}$, such that desorption of physisorbed SAM precursor occurs at a rapid rate (relative to the treatment or deposition processes) and does not adversely affect the population of chemisorbed SAM on the substrate materials to be blocked. It is also possible that physisorbed SAM molecules actively desorbing at T may also be reacting with the target substrate surface through generation of a surface or adduct that promotes or does not retard nucleation on the target substrate while not affecting blocking on the other substrate materials.

In some embodiments, the head groups of the SAM precursor react chemisorb onto the substrate surface. Unreacted head groups of the chemisorbed SAM precursors can undergo ligand exchange with a treatment co-reactant and the exchanged head groups of the SAM precursors may react with each other via a condensation reaction to yield crosslinking between the chemisorbed SAM precursors.

In some embodiments, the SAM precursor comprises more than one head group. One or more of the head groups can chemisorb onto the substrate surface. In some embodiments, at least one head group does not chemisorb onto the substrate surface and is available to react with a co-reactant. In one or more embodiments, exposing the substrate to the SAM precursor further comprises exposing the substrate to a co-reactant to form the self-assembled monolayer. The co-reactant can be co-flowed into the process chamber with the SAM precursor; either mixing prior to the process chamber or within the process chamber. In some embodiments, the co-reactant and the SAM precursor are exposed to the substrate surface sequentially so that there is no, or little, gas phase mixing of the SAM precursor and the co-reactant.

In some embodiments, the substrate is exposed to the SAM precursor at a temperature $T_{treatment}$ and to the film deposition at a temperature $T_{ALD}$ greater than $T_{treatment}$. In one or more embodiments, after cumulative exposure to the SAM precursor is complete, prior to deposition, the temperature of the substrate is elevated to $T_{treatment} < T \le T_{ALD}$ for a time to allow net selective removal of SAM precursor from the first surface. For example, the SAM precursor may chemisorb to both the first surface and the second surface and the elevated temperature may allow for the removal of the SAM precursor from the first surface so that there is more self-assembled monolayer formed on the second surface.

In some embodiments, the first surface comprises H-terminated $Si_xGe_{1-x}$, a metal, or a metal oxide, and the second surface comprises hydroxyl-terminations on a Si-containing dielectric. In one or more embodiments, the SAM precursor comprises one or more chlorosilane and/or silylamine-based molecule with a linear, saturated hydrocarbon tail of 6-20 carbons and at least one —Cl or —$NR_2$ group, where each R is independently methyl or ethyl. If a co-reactant is used, the SAM precursor may comprise one or more chlorosilane and/or silylamine-based molecule with linear, saturated hydrocarbon tail of 6-20 carbons and at least two —Cl or —$NR_2$ group, where each R is independently methyl or ethyl.

While the foregoing is directed to embodiments of the present disclosure, other and further embodiments of the disclosure may be devised without departing from the basic scope thereof, and the scope thereof is determined by the claims that follow.

What is claimed is:

1. A processing method comprising:
   providing a substrate with a first surface and a second surface;
   exposing the substrate to a SAM precursor to form a self-assembled monolayer on the second surface;
   depositing a film on the first surface selectively over the second surface; and
   removing the self-assembled monolayer from the second surface,
   wherein the SAM precursor comprises a composition with a head group that adsorbs to the second surface and a tail group that associates through van der Waals interaction, and
   wherein unreacted head groups of chemisorbed SAM precursors undergo ligand exchange with a treatment co-reactant and subsequently exchanged head groups of the SAM precursors react with each other via a condensation reaction to yield crosslinking between the chemisorbed SAM precursors.

2. The method of claim 1, wherein the SAM precursor comprises more than one head group.

3. The method of claim 1, wherein exposing the substrate to the SAM precursor further comprises exposing the substrate to a co-reactant to form the self-assembled monolayer.

4. The method of claim 3, wherein the co-reactant is co-flowed into a process chamber with the SAM precursor.

5. The method of claim 3, wherein the SAM precursor and the co-reactant are sequentially exposed to the substrate.

6. The method of claim 1, wherein the substrate is exposed to the SAM precursor at a temperature $T_{treatment}$ and to the film deposition at a temperature $T_{ALD}$ greater than $T_{treatment}$.

7. The method of claim 6, wherein after cumulative exposure to the SAM precursor are complete but prior to deposition, the temperature of the substrate is elevated to $T_{treatment} < T \le T_{ALD}$ for a time to allow net selective removal of SAM precursor from the first surface.

8. The method of claim 3, wherein the SAM precursor and the co-reactant are exposed to the substrate a temperature in the range of about room temperature to about 250° C. and at a pressure up to about 760 Torr.

9. The method of claim 1, wherein the first surface comprises H-terminated $Si_xGe_{1-x}$, a metal, or a metal oxide, and the second surface comprises hydroxyl-terminations on a Si-containing dielectric.

10. The method of claim 7, wherein the SAM precursor comprises one or more chlorosilane and/or silylamine-based molecule with a linear, saturated hydrocarbon tail of 6-20 carbons and at least one —Cl or —$NR_2$ group, where each R is independently methyl or ethyl.

11. A processing method comprising:
    providing a substrate with a first surface and a second surface;
    exposing the substrate to a SAM precursor to form a self-assembled monolayer on the second surface, the SAM precursor comprising a composition with a head group that adsorbs to the second surface and a tail group that associates with other tail groups through van der Waals interaction;
    depositing a film on the first surface selectively over the second surface; and
    removing the self-assembled monolayer from the second surface.

12. The method of claim 11, wherein exposing the substrate to the SAM precursor further comprises exposing the substrate to a co-reactant to form the self-assembled monolayer.

13. The method of claim 12, wherein the co-reactant is co-flowed into a process chamber with the SAM precursor.

14. The method of claim 12, wherein the SAM precursor and the co-reactant are sequentially exposed to the substrate.

15. The method of claim 12, wherein the substrate is exposed to the SAM precursor at a temperature $T_{treatment}$ and to the film deposition at a temperature $T_{ALD}$ greater than $T_{treatment}$, wherein after cumulative exposure to the SAM precursor but prior to deposition, the temperature of the substrate is elevated to $T_{treatment} < T \le T_{ALD}$ for a time to allow net selective removal of the SAM precursor from the first surface.

16. A processing method comprising:
    providing a substrate with a first surface and a second surface, the first surface comprises H-terminated $Si_xGe_{1-x}$, metal, or metal oxide, and the second surface comprises hydroxyl-terminations on a Si-based dielectric;

exposing the substrate to a SAM precursor and a co-reactant to form a self-assembled monolayer on the second surface, the SAM precursor comprising a composition with a head group that adsorbs to the second surface and a tail group that associates with other tail groups through van der Waals interaction, wherein forming the self-assembled monolayer occurs at a temperature $T_{treatment}$, the SAM precursor is a chlorosilane and/or silylamine-based molecule with a linear, saturated hydrocarbon tail of 6-20 carbons and at least two —Cl and/or —$NR_2$ groups, where each R is independently methyl or ethyl;

elevating the temperature of the substrate to a temperature T greater than $T_{treatment}$ and holding the substrate at temperature T for a time;

elevating the temperature of the substrate to a temperature $T_{ALD}$ greater than or equal to T and depositing a film on the first surface selectively over the second surface by atomic layer deposition; and removing the self-assembled monolayer from the second surface.

* * * * *